US012796193B2

(12) United States Patent
Luo

(10) Patent No.: US 12,796,193 B2
(45) Date of Patent: Nov. 10, 2026

(54) DISPLAY PANEL, MANUFACTURING METHOD THEREOF, AND SPLICING DISPLAY DEVICE

(71) Applicant: TCL CHINA STAR OPTOELECTRONICS TECHNOLOGY CO., LTD., Shenzhen (CN)

(72) Inventor: Chuanbao Luo, Shenzhen (CN)

(73) Assignee: TCL CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 792 days.

(21) Appl. No.: 17/789,567

(22) PCT Filed: Jun. 23, 2022

(86) PCT No.: PCT/CN2022/100798
§ 371 (c)(1),
(2) Date: Jun. 28, 2022

(87) PCT Pub. No.: WO2023/226127
PCT Pub. Date: Nov. 30, 2023

(65) Prior Publication Data
US 2023/0420624 A1 Dec. 28, 2023

(51) Int. Cl.
*H10H 20/857* (2025.01)
*G09F 9/302* (2006.01)
(Continued)

(52) U.S. Cl.
CPC ......... *H10H 20/857* (2025.01); *G09F 9/3026* (2013.01); *G09F 9/33* (2013.01);
(Continued)

(58) Field of Classification Search
CPC .... H10H 20/857; H10H 20/01; H10H 20/853; H10H 20/0362; H10H 20/0364;
(Continued)

(56) References Cited

U.S. PATENT DOCUMENTS 11,289,464 B2 * 3/2022 Liang et al. ....... H10D 86/0212
11,488,987 B2 * 11/2022 Liu et al. ............ H01L 25/0655
(Continued)

FOREIGN PATENT DOCUMENTS

CN 105355634 A 2/2016
CN 109585462 A 4/2019
(Continued)

OTHER PUBLICATIONS

Glass's Young Modulus (Year: 2001).*
(Continued)

*Primary Examiner* — Christine S. Kim
*Assistant Examiner* — Nathalie R Fayette
(74) *Attorney, Agent, or Firm* — Rivka Friedman

(57) ABSTRACT

The present application provides a display panel, a manufacturing method thereof, and a splicing display device. The display panel includes: a substrate; a driving circuit layer, and the driving circuit layer includes a plurality of thin film transistors; light-emitting units; and a plurality of scanning lines and a plurality of data lines disposed on a side of the substrate away from the driving circuit layer. The display panel comprises a plurality of display areas, and each of the display areas is provided with one of the light-emitting units and one of the thin film transistors electrically connected to the one of the light-emitting units, one of the scanning lines, and one of the data lines, respectively.

11 Claims, 5 Drawing Sheets

(51) Int. Cl.
*G09F 9/33* (2006.01)
*H10H 20/01* (2025.01)
*H10H 20/853* (2025.01)

(52) U.S. Cl.
CPC .......... *H10H 20/01* (2025.01); *H10H 20/853* (2025.01); *H10H 20/0362* (2025.01); *H10H 20/0364* (2025.01)

(58) Field of Classification Search
CPC .... H10H 20/85; H10H 20/036; G09F 9/3026; G09F 9/33; G09F 9/302; H01L 25/0753; H01L 25/167; H10D 86/441; H10D 86/60; H10W 90/00
See application file for complete search history.

(56) References Cited

U.S. PATENT DOCUMENTS

| | | | | |
|---|---|---|---|---|
| 11,545,508 | B2* | 1/2023 | Yuan et al. | H10K 77/111 |
| 2019/0131377 | A1* | 5/2019 | Kwon et al. | H10K 50/844 |
| 2020/0091273 | A1* | 3/2020 | Lee et al. | H10K 59/18 |
| 2021/0265271 | A1* | 8/2021 | Chung | H01L 23/535 |
| 2021/0327995 | A1* | 10/2021 | Yao | H10K 59/1201 |
| 2021/0331441 | A1* | 10/2021 | Yan et al. | B32B 27/36 |
| 2022/0199650 | A1* | 6/2022 | Wang | H10D 86/441 |
| 2023/0215979 | A1* | 7/2023 | Kim et al. | H01L 25/0753<br>257/495 |

FOREIGN PATENT DOCUMENTS

| | | | | | |
|---|---|---|---|---|---|
| CN | 109904080 | A | | 6/2019 | |
| CN | 109904186 | A | | 6/2019 | |
| CN | 110034150 | A | | 7/2019 | |
| CN | 111244129 | A | | 6/2020 | |
| CN | 111430413 | A | | 7/2020 | |
| CN | 112736096 | A | | 4/2021 | |
| CN | 113380846 | A | * | 9/2021 | H10D 86/441 |
| KR | 20170132940 | A | | 12/2017 | |

OTHER PUBLICATIONS

Polyimide's Young Modulus from Mit.edu on May 15, 2025 (Year: 2025).*

Li et al. (CN 113380846 A with machine translation—Li46) (Year: 2021).*

International Search Report in International application No. PCT/CN2022/100798,mailed on Dec. 19, 2022.

Written Opinion of the International Search Authority in International application No. PCT/CN2022/100798,mailed on Dec. 19, 2022.

Chinese Office Action issued in corresponding Chinese Patent Application No. 202210570522.X dated Feb. 8, 2025, pp. 1-7.

* cited by examiner

DISPLAY PANEL, MANUFACTURING METHOD THEREOF, AND SPLICING DISPLAY DEVICE

BACKGROUND OF INVENTION

Field of Invention

The present application relates to a field of display technology, and specifically to a display panel, a manufacturing method thereof, and a splicing display device.

Description of Prior Art

A submillimeter light-emitting diode (mini-LED) and a micron light-emitting diode (micro-LED) are collectively referred to as M-LEDs. M-LED display technology has entered a stage of accelerated development in recent years. Compared with an organic light-emitting diode (OLED) screen, an M-LED display shows better performance in cost, contrast, high brightness, and thin and lightweight shape. In the M-LED display technology, subject to a size limitation of a transfer equipment in a rear section, types of current M-LED transfer substrates are all small- and medium-sized, so in order to realize its large-sized commercial display applications, it is necessary to correspondingly develop seamless splicing technology.

However, current M-LED splicing methods are mainly realized by a method of side printed lines or side physical vapor deposition (PVD) film-formation, which is difficult to manufacture and has high cost. In addition, since the side printed lines and the side PVD film-formation both form line structures on sides, it is difficult to achieve seamless splicing, and the line structures of the sides are easily scratched due to mutual extrusion during a splicing process, resulting in a decline in yield.

SUMMARY OF INVENTION

The present application provides a display panel, a manufacturing method thereof, and a splicing display device, which can effectively solve problems that an existing M-LED splicing display is difficult to achieve a seamless splicing and a splicing yield is low.

In order to achieve above purposes, the display panel, the manufacturing method thereof, and the splicing display device of the present application adopt following technical schemes.

On one hand, the present application provides a display panel, wherein the display panel includes:

- a substrate;
- a driving circuit layer disposed on a side of the substrate, and the driving circuit layer includes a plurality of thin film transistors;
- a plurality of light-emitting units disposed on a side of the driving circuit layer away from the substrate; and
- a plurality of scanning lines and a plurality of data lines disposed on a side of the substrate away from the driving circuit layer;
- wherein the display panel includes a plurality of display areas arranged in an array, and each of the display areas is correspondingly provided with one of the light-emitting units and one of the thin film transistors electrically connected to the one of the light-emitting units, one of the scanning lines, and one of the data lines, respectively.

Alternatively, the display panel further includes gap areas defined among the plurality of display areas, wherein the display panel further includes a buffer layer disposed between the substrate and the driving circuit layer, and the buffer layer is defined with grooves in the gap areas.

Alternatively, the display panel further includes an encapsulation layer disposed on a side of the light-emitting units away from the driving circuit layer, the encapsulation layer includes an encapsulation cover plate, and a hardness of the encapsulation cover plate is greater than a hardness of the substrate.

Alternatively, a surface roughness of the side of the substrate away from the driving circuit layer is greater than a surface roughness of a side of the substrate facing the driving circuit layer; wherein the display panel further includes a planarization layer, the planarization layer is disposed on a surface of the side of the substrate away from the driving circuit layer, and the data lines and the scanning lines are all located on a side of the planarization layer away from the substrate.

Alternatively, the display panel further includes a plurality of vias penetrating the substrate and the planarization layer, and the data lines and the scanning lines are electrically connected to the thin film transistors through the vias, respectively; wherein an opening area of each of the vias gradually increases in a direction of the substrate away from the driving circuit layer.

Alternatively, the display panel further includes a first metal layer disposed on the side of the planarization layer away from the substrate, an interlayer insulating layer disposed on a side of the first metal layer away from the planarization layer, and a second metal layer disposed on a side of the interlayer insulating layer away from the first metal layer, wherein the first metal layer includes the scanning lines, and the second metal layer includes the data lines.

On another hand, the present application further provides a manufacturing method of a display panel, the manufacturing method of the display panel includes:

- providing a bearing plate, and forming a substrate on a side of the bearing plate;
- forming a driving circuit layer on a side of the substrate away from the bearing plate;
- forming a plurality of light-emitting units on a side of the driving circuit layer away from the substrate;
- forming an encapsulation layer on sides of the driving circuit layer and the light-emitting units away from the substrate, so as to form a display substrate on the bearing plate;
- peeling the display substrate from the bearing plate; and
- forming a plurality of data lines and a plurality of scanning lines on a side of the substrate away from the driving circuit layer, so as to form the display panel;
- wherein the display panel includes a plurality of display areas arranged in an array, and each of the display areas is correspondingly provided with one of the light-emitting units and a thin film transistor electrically connected to the one of the light-emitting units, one of the scanning lines, and one of the data lines, respectively.

Alternatively, after forming the substrate on the side of the bearing plate, the manufacturing method further includes a following step:

- forming a buffer layer including grooves on the side of the substrate away from the bearing plate;
- wherein the display panel further includes gap areas defined among the plurality of display areas, the buffer layer is disposed between the substrate and the driving circuit layer, and the grooves are located in the gap areas.

Alternatively, after peeling the display substrate from the bearing plate, the manufacturing method further includes following steps:

forming a planarization layer on a surface of the substrate away from the driving circuit layer, and forming a plurality of vias penetrating the planarization layer and the substrate.

On another hand, the present application further provides a splicing display device, the splicing display device includes a shell and a plurality of display panels described in any one of the above embodiments; wherein the shell defines a holding space, the plurality of display panels are arranged in the holding space in an array, and two adjacent ones of the display panels are in contact with each other.

The present application provides the display panel, the manufacturing method thereof, and the display device. In the present application, the display panel is divided into the plurality of display areas in a unit of the one of the light-emitting units, and each of the display areas is correspondingly provided with one of the light-emitting units and one of the thin film transistors electrically connected to the one of the light-emitting units, one of the scanning lines, and one of the data lines, respectively. By transferring the scanning lines used for transmitting scanning signals and the data lines used for transmitting data signals to the thin film transistors in the display areas from an original driving circuit layer to the side of the substrate away from the driving circuit layer, the present application can avoid problems of a large frame width, an easy scratching of line structures, and a low yield of the display panel caused by a formation of the line structures on a side of the display panel.

BRIEF DESCRIPTION OF DRAWINGS

In order to more clearly explain technical solutions in embodiments of the present application, following will briefly introduce drawings that need to be used in descriptions of the embodiments. It is obvious that the drawings in the following description are only some embodiments of the present application. For those skilled in the art, other drawings can be obtained from these drawings without creative work.

DETAILED DESCRIPTION OF EMBODIMENTS

Figure 1:
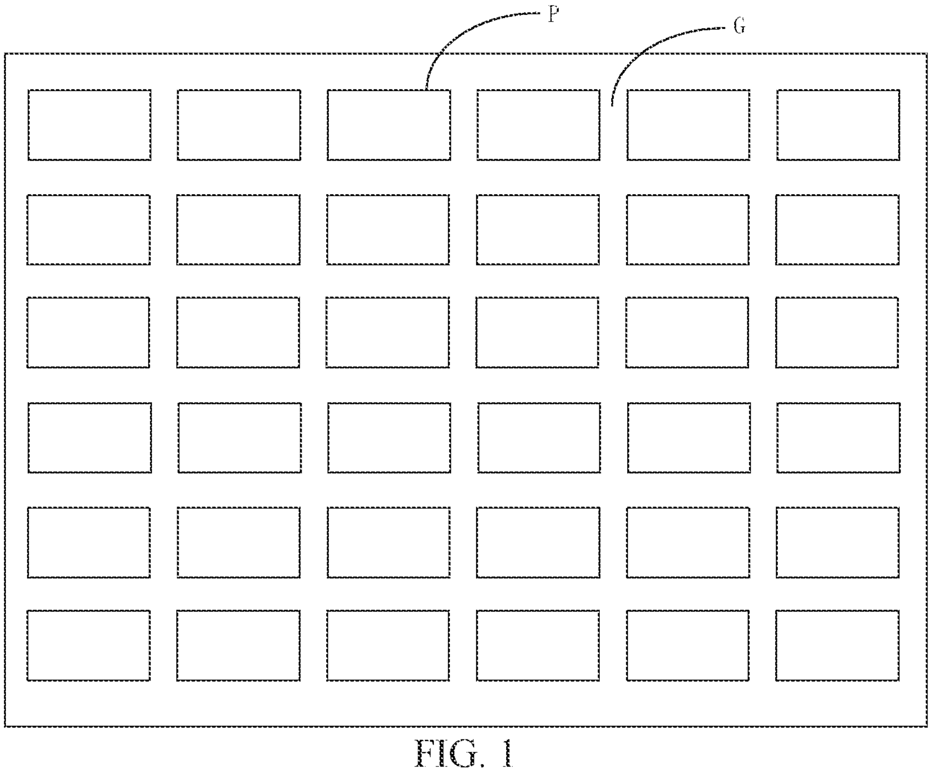
FIG. 1 is a schematic planar diagram of a display panel provided by an embodiment of the present application.

Technical solutions in embodiments of the present application will be described clearly and completely below in combination with drawings in the embodiments of the present application. Obviously, the described embodiments are only part of the embodiments of the present application, not all of the embodiments. Based on the embodiments in the present application, all other embodiments obtained by those skilled in the art without making creative work fall within a protection scope of the present application. In addition, it should be understood that specific embodiments described herein are only for a purpose of explaining and interpreting the present application and are not intended to limit the present application. In the present application, in an absence of a contrary explanation, location words used, such as "up" and "down", usually refer to the up and down under an actual use or a working state of devices, specifically drawing directions in the attached drawings; and words "inside" and "outside" are for outline of the devices.

A following disclosure provides many different embodiments or examples for implementing different structures of the present application. In order to simplify the disclosure of the present application, components and settings of specific examples are described below. Of course, they are merely examples and are not intended to limit the present application. In addition, the present application may repeat reference numerals and/or reference letters in different examples for a purpose of simplification and clarity, and does not in itself indicate relationships between the various embodiments and/or settings discussed. In addition, the present application provides examples of various specific processes and materials, but those skilled in the art may be aware of the present application of other processes and/or uses of other materials. The following is a detailed description. It should be noted that an order of description of the following embodiments is not a limitation of a preferred order of the embodiments.

Inventors of the present application have found that current M-LED splicing methods are mainly realized by a method of side printed lines or side physical vapor deposition (PVD) film-formation, which is difficult to manufacture and has high cost. In addition, since the side printed lines and the side PVD film-formation both form line structures on sides, these cause a frame of a display panel to be wide, and it is difficult to achieve seamless splicing. In addition, line structures of the sides are easily scratched due to mutual extrusion during a splicing process, resulting in a decline in yield.

A display panel, a manufacturing method thereof, and a splicing display device provided by the present application aim to solve the above technical problems of the prior art.

Technical solutions of the present application and how the technical solutions of the present application solve the above technical problems will be described in detail with specific embodiments.

Figure 2:
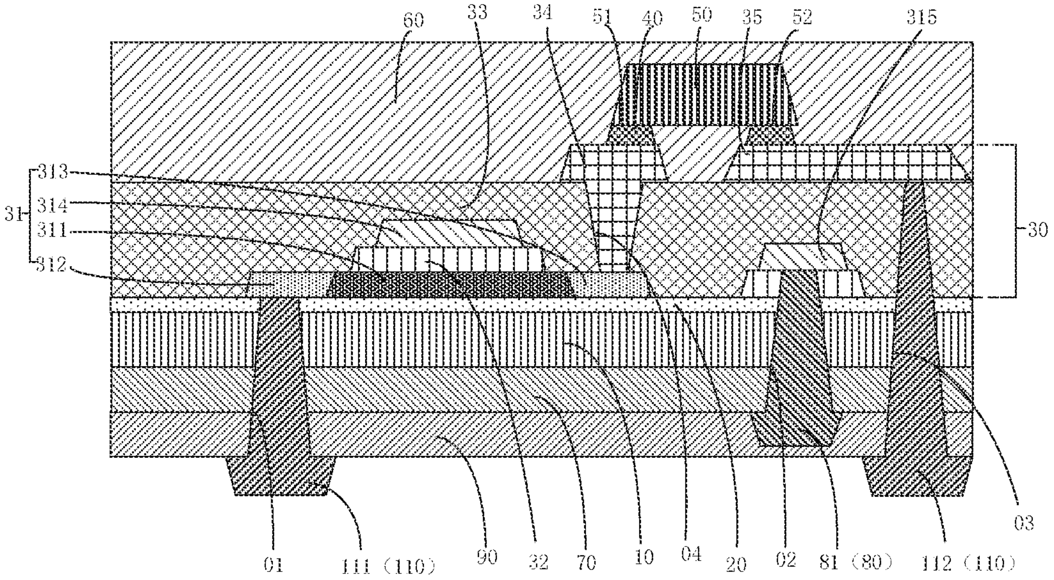
FIG. 2 is a schematic cross-sectional diagram of the display panel in one display area provided by the embodiment of the present application.

FIG. 1 is a schematic planar diagram of a display panel provided by an embodiment of the present application; FIG. 2 is a schematic cross-sectional diagram of the display panel in one display area provided by the embodiment of the present application. Referring to FIG. 1 and FIG. 2, the embodiment of the present application provides the display panel, and the display panel includes: a substrate 10; a driving circuit layer 30 disposed on a side of the substrate 10, and the driving circuit layer 30 includes a plurality of thin film transistors 31; a plurality of light-emitting units 50 disposed on a side of the driving circuit layer 30 away from the substrate 10; a plurality of scanning lines 81 and a plurality of data lines 111 disposed on a side of the substrate 10 away from the driving circuit layer 30. Wherein the display panel includes a plurality of display areas P arranged in an array, and each of the display areas P is correspondingly provided with one of the light-emitting units 50 and one of the thin film transistors 31, one of the thin film transistors 31 is electrically connected to a corresponding one of the light-emitting units 50, a corresponding one of the scanning lines 111, and a corresponding one of the data lines 81, respectively.

In the present application, the display panel is divided into the plurality of display areas P in a unit of a light-emitting unit 50, and each of the display areas P is provided with a thin film transistor 31 electrically connected to the light-emitting unit a data line 111, and a scanning line 81, respectively. By transferring the scanning line 81 used for transmitting a scanning signal and the data line 111 used for transmitting a data signal to the thin film transistor 31 in the display areas P from an original driving circuit layer 30 to the side of the substrate 10 away from the driving circuit layer 30, the present application can avoid problems of a large frame width, easily scratched line structures, and a low yield of the display panel caused by a formation of the line structures on a side of the display panel.

In some embodiments of the present application, the display panel is an M-LED display panel; and the substrate 10 is made of a flexible material, such as polyimide.

In some embodiments of the present application, the driving circuit layer includes the plurality of thin film transistors 31, the thin film transistors 31 are at least one type of amorphous silicon thin film transistors, low-temperature polycrystalline silicon thin film transistors, and metal oxide thin film transistors. The thin film transistor 31 includes a gate electrode 314, a source electrode 312, a drain electrode 313, and an active layer 311 including a channel The source electrode 312, the drain electrode 313, and the active layer 311 are disposed on a same layer, the gate electrode 314 is located above the channel, and a gate insulating layer 32 is located between the active layer 311 and the gate electrode 314. Furthermore, the driving circuit layer 30 includes a source-drain electrode and the active layer 311 disposed on a same layer, and the gate insulating layer 32, a gate electrode layer, a protective layer 33, and a binding electrode layer sequentially disposed on the active layer 311 in a stack. Wherein the source-drain electrode includes the source electrode 312 and the drain electrode 313, and the source-drain electrode can be formed by conducting the active layer 311; the gate electrode layer includes the gate electrode 314 and a transfer line 315, and the scanning line 81 is electrically connected to the gate electrode 314 through the transfer line 315. The binding electrode layer includes a first binding electrode 34 and a second binding electrode 35.

In some embodiments of the present application, the light-emitting unit 50 is a mini-LED chip or a micro-LED chip, and includes a first electrode 51 and a second electrode 52, wherein the first electrode 51 is one of a positive electrode and a negative electrode, and the second electrode 52 is another one of the positive electrode and the negative electrode. The first electrode 51 is electrically connected to the first binding electrode 34 through a solder 40, and the second electrode 52 is electrically connected to the second binding electrode 35 through the solder 40.

Figure 3:
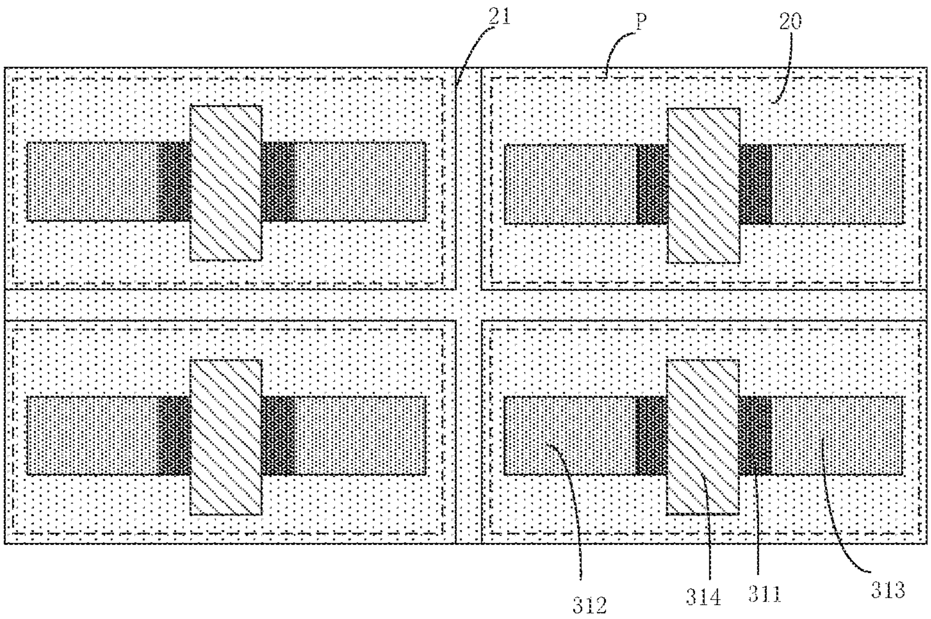
FIG. 3 is a schematic diagram of a position distribution of thin film transistors located on a buffer layer in a plurality of display areas provided by the embodiment of the present application.

FIG. 3 is a schematic diagram of a position distribution of the thin film transistors located on a buffer layer in the plurality of display areas provided by the embodiment of the present application. As shown in FIG. 1 to FIG. 3, in some embodiments of the present application, the display panel comprises the plurality of display areas P arranged in the array, and the display areas P correspond to pixel areas of the display panel one-to-one, for instance, that is, only one light-emitting unit 50 is disposed in each of the display areas P. Furthermore, at least one thin film transistor 31 is disposed in each of the display areas P, wherein the gate electrode 314, the source electrode 312, and the drain electrode 313 of the thin film transistor 31 are electrically connected to one of the scanning lines 81, one of the data lines 111, and the first electrode 51 of one of the light-emitting units 50, respectively. Wherein the gate electrode 314, the source electrode 312, and the drain electrode 313 of the thin film transistor 31 are electrically connected to the scanning line 81, the data line 111, and the first electrode 51 of the light-emitting unit 50 through a method of a via connection, respectively. Meanwhile since the substrate 10 is made of the flexible material, difficulty of opening vias in the substrate 10 can be reduced, thereby facilitating an electrical connection between the gate electrode 314 and the source electrode 312 of the thin-film transistor 31 with the scanning line 81 and the data line 111, respectively.

In some embodiments of the present application, the display panel further includes gap areas G defined among the plurality of display areas P, wherein the display panel further includes the buffer layer 20 disposed between the substrate 10 and the driving circuit layer 30, and the buffer layer 20 is defined with grooves 21 in the gap areas G among the display areas P. In the display panel provided by the present application, since the substrate 10 is made of the flexible material, the substrate 10 will be placed on a hard bearing plate in a production process, so as to facilitate a subsequent formation of the driving circuit layer 30 on a side of the substrate 10 away from the bearing plate and a binding of the light-emitting units 50. However, since the scanning lines 81 and the data lines 111 further need to be formed on the side of the substrate 10 away from the driving circuit layer 30, therefore, the production process of the display panel further includes a process of separating the substrate 10 from the bearing plate, wherein stress generated in a separation process will adversely affect the driving circuit layer 30 and the light-emitting units 50. However, the present application can effectively release the stress generated during the separation process of the substrate 10 and the bearing plate by defining the grooves 21 in the buffer layer 20 corresponding to the gap areas G among the display areas P, so as to avoid quality problems generated by the stress affecting the thin film transistors 31 and the light-emitting units 50 in the display areas P. Furthermore, a depth of each of the grooves 21 ranges from 3000 Å to 6000 Å; each of the grooves 21 includes two side walls disposed opposite to each other, and a spacing between the two side walls ranges from 10 μm to 20 μm.

In some embodiments of the present application, any two adjacent ones of the display areas P (including two horizontal adjacent ones, two vertical adjacent ones, and two diagonal adjacent ones) form a display area group, and each of the gap areas G in the display area group is defined with one of the grooves 21, so that an area of the grooves 21 in the gap areas G can be maximized to better release the stress generated during the separation process of the substrate 10 from the bearing plate. However, the present application does not limit a specific position of the grooves 21 in the buffer layer 20. In other embodiments of the present application, the grooves 21 may be disposed only in the gap area G in a part of the display area groups.

In some embodiments of the present application, the display panel further includes an encapsulation layer 60 disposed on a side of the light-emitting units 50 away from the driving circuit layer 30, the encapsulation layer 60 includes an encapsulation cover plate, the encapsulation cover plate is located at an outermost side of the encapsulation layer 60, and a hardness of the encapsulation cover plate is greater than a hardness of the substrate 10. Specifically, the encapsulation cover plate is a glass cover plate, and a hardness of the glass cover plate is greater than the hardness of the substrate 10. In the production process, when the data lines 111 and the scanning lines 81 are formed on the side of the substrate 10 away from the driving circuit layer 30, the substrate 10 needs to be inverted, since the hardness of the encapsulation layer 60 is greater than the hardness of the substrate 10, therefore, the encapsulation layer 60 can provide good support and facilitate a film-forming operation after an inversion step.

In some embodiments of the present application, a surface roughness of the side of the substrate 10 away from the driving circuit layer 30 is greater than a surface roughness of the side of the substrate 10 facing the driving circuit layer 30. Wherein the display panel further includes a planarization layer 70, the planarization layer 70 is disposed on a surface of the side of the substrate 10 away from the driving circuit layer and the data lines 111 and the scanning lines 81 are all located on a side of the planarization layer 70 away from the substrate 10. As mentioned above, the production process of the display panel includes the process of separating the substrate 10 from the bearing plate, such as a laser lift-off process, however, the laser lift-off process will increase the surface roughness of the side of the substrate 10 away from the driving circuit layer 30. Therefore, in the present application, the planarization layer 70 is disposed on the surface of the side of the substrate 10 away from the driving circuit layer 30, thereby creating a planarization condition for a subsequent arrangement of the data lines 111 and the scanning lines 81, which is conducive to improving film-forming quality of the side of the substrate 10 away from the driving circuit layer 30. Furthermore, a thickness of the planarization layer 70 ranges from 1 μm to 3 μm.

In some embodiments of the present application, the display panel further includes a plurality of vias penetrating the substrate 10 and the planarization layer 70, the data lines 111 and the scanning lines 81 are electrically connected to the thin film transistors 31 through the vias, respectively. Wherein an opening area of each of the vias gradually increases in a direction of the substrate 10 away from the driving circuit layer 30. Specifically, as mentioned above, the substrate 10 needs to be inverted before forming the planarization layer 70, accordingly, film-forming directions and shapes of the vias formed by etching will also change accordingly. Therefore, in the direction of the substrate 10 away from the driving circuit layer 30, the opening area of each of the vias penetrating the substrate 10 and the planarization layer 70 gradually increases. Wherein each of the vias penetrating the substrate 10 and the planarization layer 70 includes a first via 01 and a second via 02, the data line 111 is electrically connected to the source electrode 312 of the thin film transistor 31 through the first via 01, and the scanning line 81 is electrically connected to the gate electrode 314 of the thin film transistor 31 through the second via 02 and the transfer line 315. Furthermore, diameters of the first via 01 and the second via 02 range from 6 μm to 10 μm, and a process of the etching is dry etching.

In some embodiments of the present application, the display panel further includes a VDD wiring and a VSS wiring 112, the VDD wiring and the VSS wiring 112 are further disposed on the side of the substrate 10 away from the driving circuit layer 30, each of the vias penetrating the substrate 10 and the planarization layer 70 further includes a third via 03, and the VSS wiring 112 is electrically connected to the second electrode 52 of the light-emitting unit 50 through the third via 03.

In some embodiments of the present application, the display panel further includes a via located in the driving circuit layer 30, such as a fourth via 04. The first electrode 51 of the light-emitting unit 50 is electrically connected to the drain electrode 313 of the thin film transistor 31 through the first binding electrode 34 and the fourth via 04. An opening area of the fourth via 04 gradually decreases in the direction of the substrate 10 away from the driving circuit layer 30.

In some embodiments of the present application, the scanning lines 81 and the data lines 111 are respectively located in different film layers. Specifically, the display panel further includes a first metal layer 80, an interlayer insulating layer 90, and a second metal layer 110 located on the side of the planarization layer 70 away from the substrate 10. One of the scanning lines 81 and the data lines 111 is formed by patterning the first metal layer 80, and another of the scanning lines 81 and the data lines 111 is formed by patterning the second metal layer 110. Furthermore, the display panel includes the first metal layer 80 disposed on the side of the planarization layer 70 away from the substrate 10, the interlayer insulating layer 90 disposed on a side of the first metal layer 80 away from the planarization layer 70, and the second metal layer 110 disposed on a side of the interlayer insulating layer 90 away from the first metal layer 80, wherein the first metal layer 80 includes the scanning lines 81, and the second metal layer 110 includes the data lines 111. By disposing the scanning lines 81 and the data lines 111 in different layers, transmission of different signals in different metal layers can be realized and difficulty of a routing design can be reduced.

Figure 4:
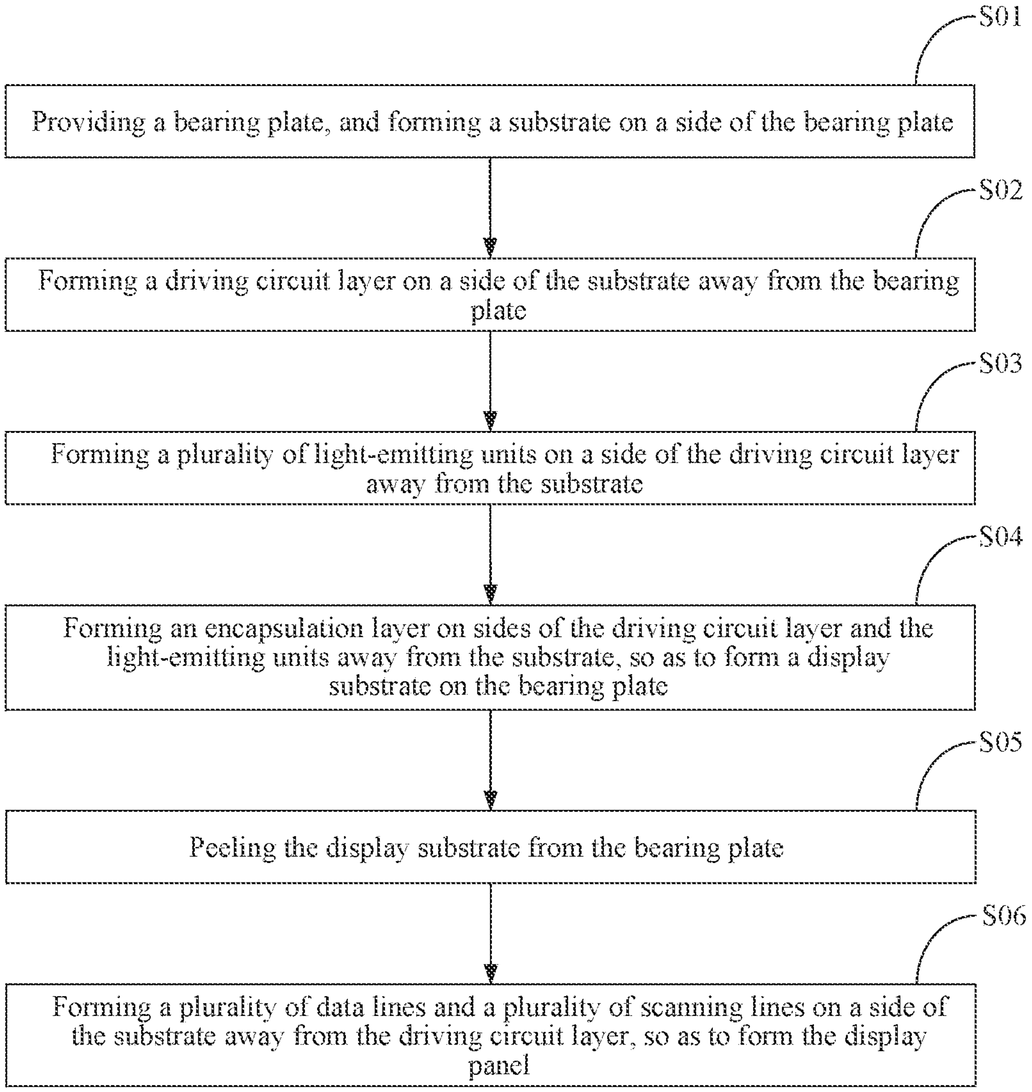
FIG. 4 is a schematic flow diagram of a manufacturing method of the display panel provided by an embodiment of the present application.

On another hand, the present application further provides a manufacturing method of the display panel. FIG. 4 is a schematic flow diagram of the manufacturing method of the display panel provided by an embodiment of the present application. Referring to FIG. 1 to FIG. 4, the manufacturing method of the display panel includes following steps:

S01: providing a bearing plate, and forming a substrate 10 on a side of the bearing plate;

S02: forming a driving circuit layer 30 on a side of the substrate 10 away from the bearing plate;

S03: forming a plurality of light-emitting units 50 on a side of the driving circuit layer 30 away from the substrate 10;

S04: forming an encapsulation layer 60 on sides of the driving circuit layer 30 and the light-emitting units 50 away from the substrate 10, so as to form a display substrate on the bearing plate;

S05: peeling the display substrate from the bearing plate; and

S06: forming a plurality of data lines 111 and a plurality of scanning lines 81 on a side of the substrate 10 away from the driving circuit layer 30, so as to form the display panel;

Wherein the display panel includes the plurality of display areas P arranged in an array, and each of the display areas P is correspondingly provided with one of the light-emitting units 50 and one of the thin film transistors 31 electrically connected to the one of the light-emitting units 50, one of the scanning lines 111, and one of the data lines 81, respectively.

Figure 5:
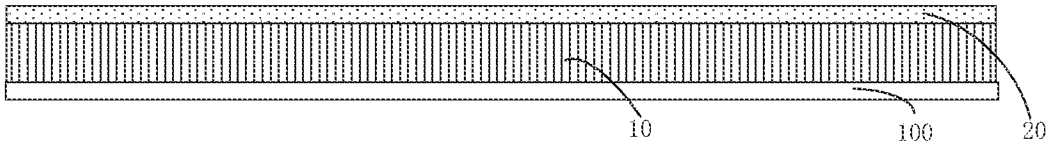
FIG. 5 is a schematic cross-sectional diagram of forming a substrate and the buffer layer on a side of a bearing plate provided by the embodiment of the present application.

FIG. 5 is a schematic cross-sectional diagram of forming the substrate and the buffer layer on a side of the bearing plate provided by the embodiment of the present application. Referring to FIG. 3 and FIG. 5, in some embodiments of the present application, the step S01 includes: a step S01-1: providing the bearing plate 100 and forming the substrate 10 on the bearing plate 100; and a step S01-2: forming the buffer layer 20 including the grooves 21 on the side of the substrate 10 away from the bearing plate 100. Wherein the display panel further includes the gap areas G defined among the plurality of display areas P, the buffer layer 20 is disposed between the substrate 10 and the driving circuit layer 30, and the grooves 21 are located in the gap areas G.

Figure 6:
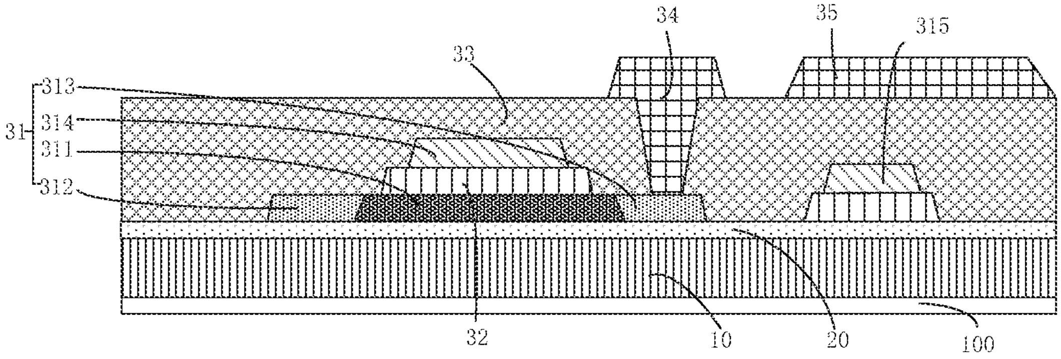
FIG. 6 is a schematic cross-sectional diagram of forming a driving circuit layer on a side of the substrate away from the bearing plate provided by the embodiment of the present application.

FIG. 6 is a schematic cross-sectional diagram of forming the driving circuit layer on the side of the substrate away from the bearing plate provided by the embodiment of the present application. Referring to FIG. 6, in some embodiments of the present application, the step S02 includes: preparing and forming the driving circuit layer 30 on the substrate 10. Wherein the driving circuit layer 30 includes the plurality of thin film transistors 31, each of the thin film transistors 31 includes the active layer 311, the source electrode 312, the drain electrode 313, and the gate electrode 314, the driving circuit layer 30 further includes a plurality of first binding electrodes 34 and a plurality of second binding electrodes 35, and the first binding electrode 34 is electrically connected to the drain electrode 313 of the thin film transistor 31 through the fourth via 04 formed in the driving circuit layer 30.

Figure 7:
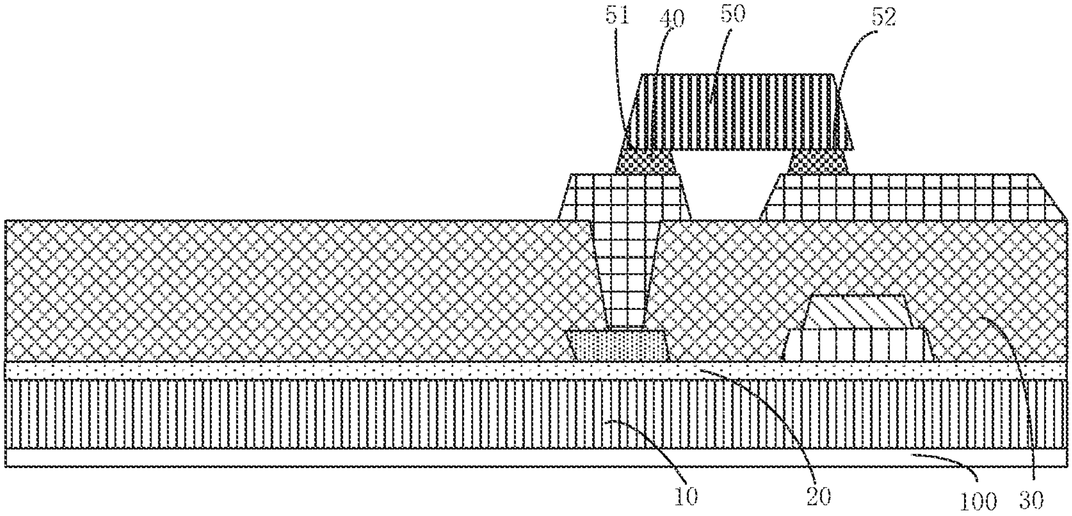
FIG. 7 is a schematic cross-sectional diagram of forming light-emitting units on a side of the driving circuit layer away from the substrate provided by the embodiment of the present application.

FIG. 7 is a schematic cross-sectional diagram of forming the light-emitting units on the side of the driving circuit layer away from the substrate provided by the embodiment of the present application. Referring to FIG. 7, in some embodiments of the present application, the step S03 includes: transferring the plurality of light-emitting units 50 arranged in an array on a substrate to be transferred to the driving circuit layer binding and electrically connecting the first electrode 51 of the light-emitting unit with the first binding electrode 34 through the solder 40, and binding and electrically connecting the second electrode 52 of the light-emitting unit 50 with the second binding electrode 35 through the solder 40.

Figure 8:
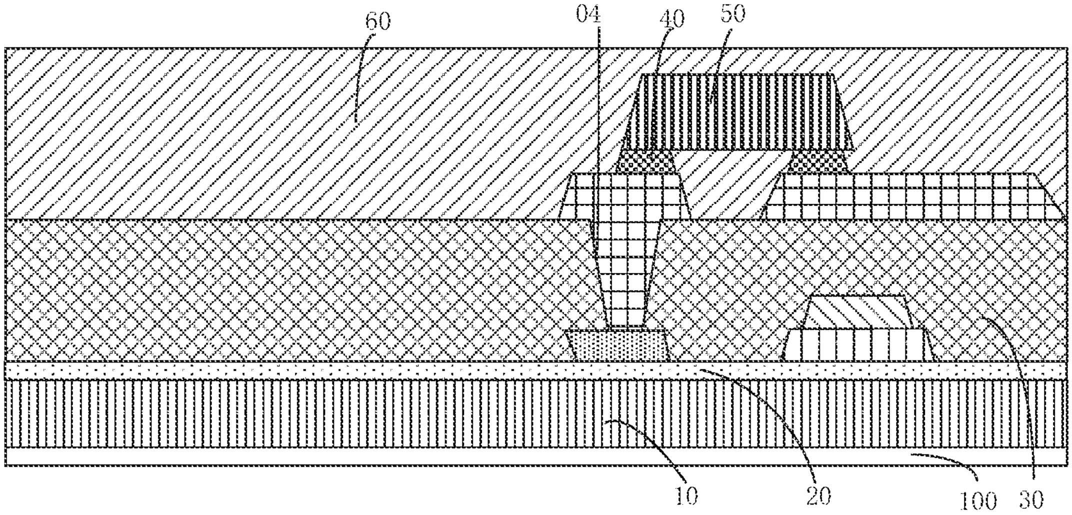
FIG. 8 is a schematic cross-sectional diagram of forming an encapsulation layer on sides of the driving circuit layer and the light-emitting units away from the substrate provided by the embodiment of the present application.

FIG. 8 is a schematic cross-sectional diagram of forming the encapsulation layer on the sides of the driving circuit layer and the light-emitting units away from the substrate provided by the embodiment of the present application. Referring to FIG. 8, in some embodiments of the present application, the step S04 includes: forming the encapsulation layer 60 on the driving circuit layer 30 and the light-emitting unit 50, so as to form the display substrate on the bearing plate 100. Wherein the encapsulation layer 60 includes the encapsulation cover plate.

Figure 9:
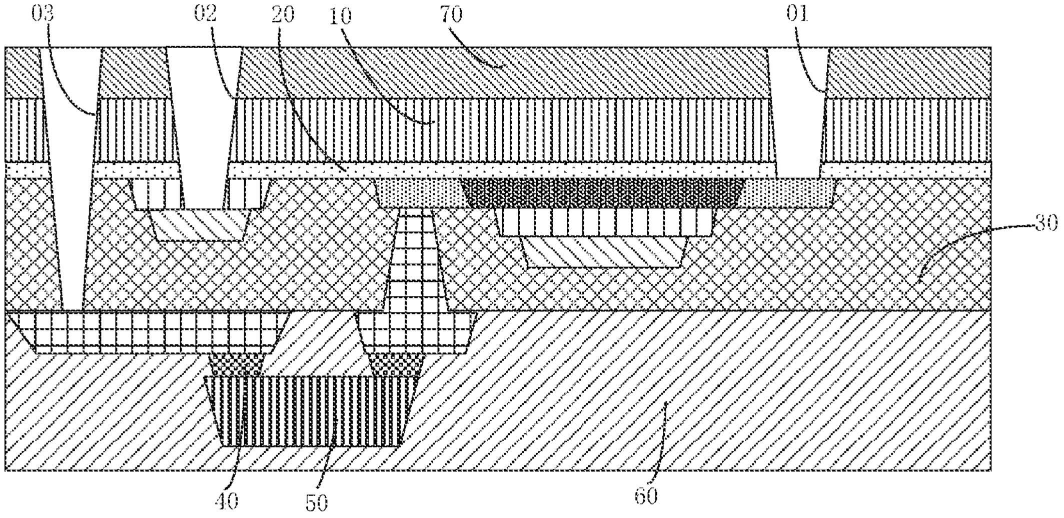
FIG. 9 is a schematic cross-sectional diagram of forming a planarization layer on a surface of the substrate away from the driving circuit layer provided by the embodiment of the present application.

FIG. 9 is a schematic cross-sectional diagram of forming the planarization layer on the surface of the substrate away from the driving circuit layer provided by the embodiment of the present application. Referring to FIG. 9, in some embodiments of the present application, the step S05 includes: a step S05-1: peeling the display substrate from the bearing plate 100 by a method of laser lift-off. Due to strong laser energy, a plurality of uneven microstructures are formed on the surface of the side of the substrate 10 away from the driving circuit layer 30, so that the surface roughness of the substrate 10 away from the driving circuit layer 30 is greater than the surface roughness of the substrate 10 facing the driving circuit layer 30. Therefore, the step S05 further includes a step S05-02: turning the display substrate upside down, forming the planarization layer 70 on the surface of the side of the substrate 10 away from the driving circuit layer 30, and forming the plurality of vias penetrating the planarization layer 70 and the substrate 10. Wherein, the data lines 111 and the scanning lines 81 are electrically connected to the thin film transistors 31 through the vias penetrating the planarization layer 70 and the substrate 10, and the opening area of each of the vias gradually increases in the direction of the substrate 10 away from the driving circuit layer 30. Furthermore, after the display substrate is turned upside down, organic photoresist is coated on the surface of the side of the substrate 10 away from the driving circuit layer 30 and thermally cured to form the planarization layer 70.

Figure 10:
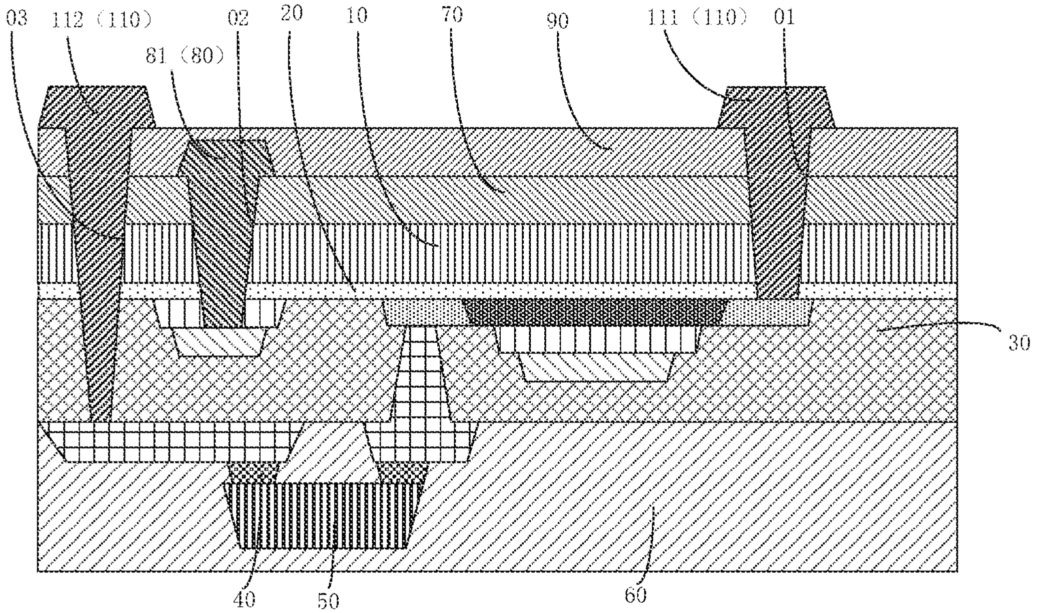
FIG. 10 is a schematic cross-sectional diagram of forming data lines and scanning lines on a side of the planarization layer away from the substrate provided by the embodiment of the present application.

FIG. 10 is a schematic cross-sectional diagram of forming the data lines and the scanning lines on the side of the planarization layer away from the substrate provided by the embodiment of the present application. Referring to FIG. 10, in some embodiments of the present application, the step S06 includes: a step S06-1: forming the first metal layer 80 on the side of the planarization layer 70 away from the substrate 10, and patterning the first metal layer 80 to form the scanning lines 81. Wherein the scanning line 81 is electrically connected to the transfer line 315 through the second via 02 penetrating the planarization layer 70 and the substrate 10, and then electrically connected to the gate electrode 314 of the thin film transistor 31 through the transfer line 315; a step S06-2: forming the interlayer insulating layer 90 on the side of the first metal layer 80 away from the planarization layer 70, and etching and perforating the interlayer insulating layer 90; and step S06-3: forming the second metal layer 110 on the side of the interlayer insulating layer 90 away from the first metal layer 80, and patterning the second metal layer 110 to form the data lines 111, the VDD line, and the VSS line 112. Wherein the data line 111 is electrically connected to the source electrode 312 of the thin film transistor 31 through the first via 01 penetrating the planarization layer 70 and the substrate 10; the VSS line 112 is electrically connected to the second binding electrode 35 through the third via 03 penetrating the planarization layer 70 and the substrate 10, and then is electrically connected to the second electrode 52 of the light-emitting unit 50 through the second binding electrode 35.

On another hand, the present application further provides a splicing display device. The splicing display device includes a shell and the plurality of display panels described in any one of the above embodiments, wherein the shell defines a holding space, the plurality of display panels are arranged in the holding space in an array, and two adjacent ones of the display panels are in contact with each other.

To sum up, the present application provides the display panel, the manufacturing method thereof, and the splicing display device. The display panel includes: the substrate; the driving circuit layer disposed on the side of the substrate, and the driving circuit layer includes the plurality of thin film transistors; the plurality of light-emitting units disposed on the side of the driving circuit layer away from the substrate; the plurality of scanning lines and the plurality of data lines disposed on the side of the substrate away from the driving circuit layer; wherein the display panel includes the plurality of display areas arranged in an array, and each of the display areas is correspondingly provided with one of the light-emitting units and one of the thin film transistors electrically connected to the one of the light-emitting units, one of the scanning lines, and one of the data lines, respectively. In the present application, by disposing the scanning lines for transmitting the scanning signals and the data lines for transmitting the data signals to the thin film transistors on the side of the substrate away from the driving circuit layer, problems of a large splicing seam and a low production yield caused by disposing the line structures on the side of the display panel are avoided, thereby greatly improving a display effect of the splicing display device.

The above describes the display panel, the manufacturing method thereof, and the splicing display device provided by the embodiments of the present application in detail. In this paper, specific examples are used to explain a principle and an implementation mode of the present application. The description of the above embodiments is only used to help understand a method and a core idea of the present application. At a same time, for those skilled in the art, according to the idea of the present application, there will be changes in a specific implementation mode and a scope of application. In conclusion, contents of the specification should not be understood as restrictions on the present application.

What is claimed is:

1. A display panel, wherein the display panel comprises:
- a substrate having a first surface and a second surface opposite to each other;
- a driving circuit layer disposed on a side of the substrate, and the driving circuit layer comprises a plurality of thin film transistors;
- a plurality of light-emitting units disposed on a side of the driving circuit layer away from the substrate;
- a planarization layer disposed on the second surface of the side of the substrate away from the driving circuit layer,
- a first metal layer disposed on a side of the planarization layer away from the substrate, wherein the first metal layer comprises a plurality of scanning lines;
- an interlayer insulating layer disposed on a side of the first metal layer away from the planarization layer; and
- a second metal layer disposed on a side of the interlayer insulating layer away from the first metal layer, wherein the second metal layer comprises a plurality of data lines;
- wherein the display panel further comprises a plurality of vias, each of the plurality of vias is extended through both the substrate and the planarization layer, and the data lines and the scanning lines are electrically connected to the thin film transistors through the vias, respectively;
- wherein the display panel comprises a plurality of display areas arranged in an array, and each of the display areas is correspondingly provided with one of the light-emitting units and one of the thin film transistors electrically connected to the one of the light-emitting units, one of the scanning lines, and one of the data lines, respectively, and
- wherein the plurality of thin film transistors and the plurality of light-emitting units are disposed at a side of the first surface of the substrate, and the planarization layer, the first metal layer, and the second metal layer are disposed at a side of the second surface of the substrate.

2. The display panel according to claim 1, wherein the display panel further comprises gap areas defined among the plurality of display areas, wherein the display panel further comprises a buffer layer disposed between the substrate and the driving circuit layer, and the buffer layer is defined with grooves in the gap areas.

3. The display panel according to claim 2, wherein any two adjacent ones of the display areas form a display area group, and each of the gap areas in the display area group is defined with one of the grooves.

4. The display panel according to claim 2, wherein any two adjacent ones of the display areas form a display area group, and the gap areas in a part of the display area groups are defined with the grooves.

5. The display panel according to claim 2, wherein the display panel further comprises an encapsulation layer disposed on a side of the light-emitting units away from the driving circuit layer, the encapsulation layer comprises an encapsulation cover plate, and a hardness of the encapsulation cover plate is greater than a hardness of the substrate.

6. The display panel according to claim 2, wherein a surface roughness of the side of the substrate away from the driving circuit layer is greater than a surface roughness of a side of the substrate facing the driving circuit layer.

7. The display panel according to claim 6, wherein an opening area of each of the vias gradually increases in a direction of the substrate away from the driving circuit layer.

8. The display panel according to claim 6, wherein the display panel further comprises a first metal layer disposed on the side of the planarization layer away from the substrate, an interlayer insulating layer disposed on a side of the first metal layer away from the planarization layer, and a second metal layer disposed on a side of the interlayer insulating layer away from the first metal layer, wherein the first metal layer comprises the scanning lines, and the second metal layer comprises the data lines.

9. A manufacturing method of a display panel, comprising following steps:
- providing a bearing plate, and forming a substrate on a side of the bearing plate;
- forming a driving circuit layer on a side of the substrate away from the bearing plate;
- forming a plurality of light-emitting units on a side of the driving circuit layer away from the substrate;
- forming an encapsulation layer on sides of the driving circuit layer and the light-emitting units away from the substrate, so as to form a display substrate on the bearing plate;
- peeling the display substrate from the bearing plate; and
- forming a plurality of data lines and a plurality of scanning lines on a side of the substrate away from the driving circuit layer, so as to form the display panel;
- wherein the display panel comprises:
- the substrate having a first surface and a second surface opposite to each other;
- the driving circuit layer disposed on a side of the substrate, and the driving circuit layer comprises a plurality of thin film transistors;

the plurality of light-emitting units disposed on a side of the driving circuit layer away from the substrate;

a planarization layer disposed on the second surface of the side of the substrate away from the driving circuit layer, a first metal layer disposed on a side of the planarization layer away from the substrate, wherein the first metal layer comprises a plurality of scanning lines;

an interlayer insulating layer disposed on a side of the first metal layer away from the planarization layer; and a second metal layer disposed on a side of the interlayer insulating layer away from the first metal layer, wherein the second metal layer comprises a plurality of data lines; and wherein the display panel further comprises a plurality of vias, each of the plurality of vias is extended through both the substrate and the planarization layer, and the data lines and the scanning lines are electrically connected to the thin film transistors through the vias, respectively;

wherein the display panel comprises a plurality of display areas arranged in an array, and each of the display areas is correspondingly provided with one of the light-emitting units and one of the thin film transistors electrically connected to the one of the light-emitting units, one of the scanning lines, and one of the data lines, respectively, and wherein the plurality of thin film transistors and the plurality of light-emitting units are disposed at a side of the first surface of the substrate, and the planarization layer, the first metal layer, and the second metal layer are disposed at a side of the second surface of the substrate.

10. The manufacturing method of the display panel according to claim 9, wherein after forming the substrate on the side of the bearing plate, the manufacturing method further comprises a following step:

forming a buffer layer comprising grooves on the side of the substrate away from the bearing plate;

wherein the display panel further comprises gap areas defined among the plurality of display areas, the buffer layer is disposed between the substrate and the driving circuit layer, and the grooves are located in the gap areas.

11. The manufacturing method of the display panel according to claim 9, wherein after peeling the display substrate from the bearing plate, the manufacturing method further comprises following steps:

forming the planarization layer on a surface of the substrate away from the driving circuit layer, and forming the plurality of vias penetrating the planarization layer and the substrate.

* * * * *